United States Patent
Koen

(10) Patent No.: US 7,521,980 B2
(45) Date of Patent: Apr. 21, 2009

(54) PROCESS AND TEMPERATURE-INDEPENDENT VOLTAGE CONTROLLED ATTENUATOR AND METHOD

(75) Inventor: Myron J. Koen, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/510,167

(22) Filed: Aug. 25, 2006

(65) Prior Publication Data

US 2008/0048751 A1   Feb. 28, 2008

(51) Int. Cl.
*H03L 5/00* (2006.01)
(52) U.S. Cl. .................................... 327/308; 333/81 R
(58) Field of Classification Search ................. 327/306, 327/308, 378, 346, 538; 333/81 R
See application file for complete search history.

(56) References Cited

U.S. PATENT DOCUMENTS

| | | | |
|---|---|---|---|
| 5,077,541 A | 12/1991 | Gilbert | 330/284 |
| 5,880,618 A | 3/1999 | Koen | 327/351 |
| 6,002,354 A * | 12/1999 | Itoh et al. | 341/144 |
| 6,075,414 A | 6/2000 | Nagaoka et al. | |
| 6,229,375 B1 | 5/2001 | Koen | 326/351 |
| 6,288,564 B1 * | 9/2001 | Hedberg | 326/30 |
| 6,674,302 B2 * | 1/2004 | Yen | 326/30 |
| 6,703,682 B2 | 3/2004 | Aswell | |
| 6,836,170 B2 * | 12/2004 | Kitagawa et al. | 327/308 |
| 6,946,849 B1 * | 9/2005 | Lu | 324/601 |

* cited by examiner

*Primary Examiner*—Dinh T. Le
(74) *Attorney, Agent, or Firm*—John J. Patti; Wade J. Brady, III; Frederick J. Telecky, Jr.

(57) ABSTRACT

A circuit includes a first variable resistor having a resistance which is variable in response to a resistance control signal. A resistance control circuit includes a first current source circuit for supplying a first current through a reference resistor. A second current source circuit supplies a second current through the first variable resistor. In operational amplifier has a first input coupled to a first conductor connecting the first current source to the reference resistor, a second input coupled to a second conductor connecting the current source to the first variable resistor, and an output applying the first resistance control signal to a control terminal of the first variable resistor, to force the resistance of the first variable resistor to be equal to a resistance of the reference resistor. The resistance of a second variable resistor of an attenuator is controlled in response to the resistance control signal.

19 Claims, 3 Drawing Sheets

PROCESS AND TEMPERATURE-INDEPENDENT VOLTAGE CONTROLLED ATTENUATOR AND METHOD

BACKGROUND OF THE INVENTION

The present invention relates generally to voltage controlled variable gain attenuators and amplifiers, and more particularly to a voltage controlled variable gain attenuator and amplifier having a gain curve that is nearly independent of the effects of process variation and temperature variation.

Present medical ultrasound and industrial imaging systems employ as many as 256 signal processing channels to create a clear image. Advances in the technology associated with signal processing in this area indicate that the channel count may be higher in future systems. A typical ultrasound channel consists of a piezo-electric transducer that supplies a signal to a variable gain amplifier which in turn drives an analog to digital converter. The piezo-electric transducer is excited by a high voltage transmitter which creates a signal that is applied (for example) to a patient or to industrial material undergoing an imaging examination. The output of the analog to digital converter typically is further processed by digital circuitry and software for purposes of displaying and analyzing the image in question. Future ultrasound systems are expected to make increasing demands on the precision of the various system components to create a more precise image. One requirement for future systems is that the gain of each channel match the gains of the other channels more accurately than is the case for present systems. This is desirable because the lack of precise channel matching creates image "artifacts" which have the effect of degrading the quality of the displayed image. In effect, the image artifacts caused by the lack of precise channel matching may be erroneously interpreted as meaningful signals by an image processor.

Ultrasound signal systems employ time-dependent gain control to adjust the system gain in order to prevent system overloading. This is commonly achieved through the use of a voltage controlled variable gain amplifier. At the beginning of a sweep a gain control voltage sets the amplifier gain at its lowest level and from that point the gain is gradually increased so that weak signals can be properly amplified. (In ultrasound signal systems, a sweep or scan is the period of time between the shallowest echo and the deepest echo.) The system gain versus control characteristic increases as a function of time, and usually the gain, expressed in dB (decibels), is linearly related to the gain control voltage.

Unfortunately, one of the most unpredictable elements in this signal processing progression is the voltage controlled variable gain amplifier. Typically, to achieve a linear gain expressed in dB, a piece-wise approximation to an ideal curve has been provided. See commonly assigned. U.S. Pat. No. 6,229,375 entitled "Programmable Low Noise CMOS Differentially Voltage Controlled Logarithmic Attenuator and Method" issued May 8, 2001 to the present inventor. This technique achieves only ±1 dB gain precision, and typically is complex and costly. The closest prior art is believed to include the above mentioned U.S. Pat. No. 6,229,375 and also U.S. Pat. Nos. 5,880,618 and 5,077,541 which indicate the present state of the art in the area of voltage controlled variable gain amplifiers having gain that is linear in dB (i.e., gain that is linear when expressed in decibels). In instrumentation applications it is very common to express gain or attenuation (i.e., gain having a value of less than 1) in dB, and it also is very common to control the gain or attenuation in dB in response to a control voltage.

The use of voltage-controlled FET resistors (i.e., field effect transistors used as resistors) in various applications, including attenuators, is known. However, the precision of the resistance of FET resistors is very poor.

Band gap reference voltage circuits which produce a voltage that is proportional to absolute temperature and essentially independent of process parameter variations are well-known in the art. FIG. 6 herein shows such a bandgap reference voltage circuit Thus, there is an unmet need for a high precision, voltage-controlled (or current-controlled) variable gain circuit element which can be utilized to provide ripple-free control of attenuation, gain, or other circuit or system parameters without resorting to piecewise-linear approximation techniques.

There also is an unmet need for a high precision, voltage-controlled (or current-controlled) variable gain circuit element which can be utilized to provide ripple-free control of attenuation, gain, or other circuit or system parameters without resorting to piecewise-linear approximation techniques, and which is substantially independent of the effects of integrated circuit process parameter variations and/or temperature variations.

There also is an unmet need for a voltage-controlled variable gain amplifier which is more accurate than the prior art and is independent of the effects of process variation and temperature variation.

There also is an unmet need for a voltage controlled attenuator which is more accurate than the prior art and is independent of process variation and temperature variation and is suitable for use in the gain control portion of a voltage controlled variable gain amplifier.

SUMMARY OF THE INVENTION

It is an object of the invention to provide a high precision, voltage-controlled (or current-controlled) variable gain circuit element which can be utilized to provide ripple-free control of attenuation, gain, or other circuit or system parameters without resorting to piecewise-linear approximation techniques.

It is another object of the invention to provide a high precision, voltage-controlled (or current-controlled) variable gain circuit element which can be utilized to provide ripple-free control of attenuation, gain, or other circuit or system parameters without resorting to piecewise-linear approximation techniques, and which is substantially independent of the effects of integrated circuit process parameter variations and/or temperature variations.

It is another object of the invention to provide a voltage-controlled variable gain amplifier which is more accurate than prior art and is independent of the effects of process variation and temperature variation.

It is another object of the invention to provide a voltage controlled attenuator which is more accurate than the prior art and is independent of process variation and temperature variation and is suitable for use in the gain control portion of a voltage controlled variable gain amplifier.

Briefly described, and in accordance with one embodiment, the present invention provides a first variable resistor (13) having a resistance which is variable in response to a resistance control signal ($V_{ADJ}$). A resistance control circuit (10 in FIG. 1, 40 in FIG. 4) includes a first current source circuit (30A) for supplying a first current (I1) through a reference resistor (11). A second current source circuit (30B) supplies a second current (I2) through the first variable resistor. An operational amplifier (17) has a first input coupled to a first conductor (14) connecting the first current source to the reference resistor, a second input coupled to a second conductor (15) connecting the current source to the first variable resistor, and an output applying the first resistance control signal to a control terminal of the first variable resistor to force the resistance of the first variable resistor to be equal to a resistance of the reference resistor. The resistance of a second variable resistor (18) of an attenuator (20) is controlled in response to the resistance control signal ($V_{ADJ}$).

In one embodiment, the invention provides a circuit including a first variable resistor (13) having a first terminal and a second terminal, and also having a resistance control terminal (16), a resistance between the first terminal and the second terminal being variable in response to a first resistance control signal ($V_{ADJ}$) on the resistance control terminal. The circuit includes a resistance control circuit (10 in FIG. 1, 40 in FIG. 4) having a first current source circuit (30A) for supplying a first current (I1) through a first conductor (14) to a first terminal of a reference resistor (11) having a second terminal connected to a reference voltage conductor (GND), a second current source circuit (30B) for supplying a second current (I2) through a second conductor (15) to the first terminal of the first variable resistor (13), and a first operational amplifier (17) having a first input coupled to the first conductor (14), a second input coupled to the second conductor (15), and an output conducting the first resistance control signal ($V_{ADJ}$) by a third conductor (16) to the resistance control terminal of the first variable resistor (13), wherein the operational amplifier (17) forces a resistance of the first variable resistor (13) to be equal to a resistance of the reference resistor (11). In one embodiment, a second variable resistor (18 in FIG. 2) has a variable resistance between first and second terminals thereof, and the second variable resistor (18) has a resistance control terminal coupled to receive the first resistance control signal ($V_{ADJ}$) from the third conductor (16). In one embodiment, the circuit includes an attenuator (20) including a first input resistor (22) coupled between a first input terminal (21) and a first output terminal (22) of the attenuator (20) and a second input resistor (24) coupled between a second input terminal (23) and a second output terminal (25) of the attenuator (20), the second variable resistor (18) being coupled between the first (22) and second (25) output terminals of the attenuator (20).

In the described embodiments, the first variable resistor (13) includes a first FET resistor, wherein a gate of the first FET resistor (13) is the resistance control terminal of the first variable resistor, a drain of the first FET resistor is the first terminal of the first variable resistor (13), and a source of the first FET resistor is the second terminal of the first variable resistor (13). The first variable resistor (13) includes a first FET resistor (13A) and the second variable resistor (18) includes a first FET resistor (18A), wherein a gate, a drain, and a source of the first FET resistor (13A) of the first variable resistor (13) are the resistance control terminal, first terminal, and second terminal, respectively, of the first variable resistor (13), and wherein a gate, a drain, and a source of the first FET resistor (18A) of the second variable resistor (18) are the resistance control terminal, first terminal, and second terminal, respectively, of the second variable resistor (13).

In one embodiment, the first current source circuit (30A) includes a first exponential current circuit which produces the first current (I1) as a bias current equal to a collector current of a first bipolar transistor (Q2A), and wherein the second current source circuit (30B) includes a second exponential current circuit which produces the second current (I2) as a control current equal to a collector current of a second bipolar transistor (Q2B) in response to a second resistance control signal (Vc). The first bipolar transistor (Q2A) is a diode-connected transistor, wherein the first current source circuit (30A) includes a first current source (I3A) supplying its current to a first electrode of a third bipolar transistor (Q1A) that is diode-connected and referenced to the reference voltage conductor (GND). A second operational amplifier (29A) has a first input coupled to the first electrode of the third bipolar transistor (Q1A), an output (34A) coupled to a gate of a first field effect transistor (Q3A) having a source coupled to a second input of the second operational amplifier (29A) and a first electrode of the first bipolar transistor (Q2A), and a drain coupled to an input of a first current mirror, the first current mirror having an output supplying the first current (I1). The second current source circuit (30B) includes a second current source (I3B) supplying its current to a first electrode of a fourth bipolar transistor (Q1B) that is diode-connected and referenced to the reference voltage conductor (GND), a third operational amplifier (29B) having a first input coupled to the first electrode of a fourth bipolar transistor (Q1B), an output (34B) coupled to a gate of a second field effect transistor (Q3B) having a source coupled to a second input of the third operational amplifier (29B) and a first electrode of the second bipolar transistor (Q2B), and a drain coupled to an input of a second current mirror, the second current mirror having an output supplying the second current (I2). In this described embodiment, the first (Q2A), second (Q2B), third (Q1A), and fourth (Q1B) bipolar transistors are PNP transistors having their collectors coupled to the reference voltage conductor (GND) and wherein the first (Q3A) and second (Q3B) field effect transistors are N-channel transistors. The multiplier circuit (42) includes first multiplier circuitry (43A,46) receiving a reference voltage (Vref) and the bandgap voltage (Vo) for producing the voltage (38) proportional to the bandgap voltage (Vo), and also includes second multiplier circuitry (43B,47) for producing the second control voltage (Vc) proportionally to the external control voltage (Vcon) and the voltage (38) proportional to the bandgap voltage (Vo).

Temperature compensation circuitry (42,50) compensates a temperature dependency in a gain A of the attenuator (20), and includes a bandgap circuit (50) and a multiplier circuit (42) for multiplying a voltage (38) proportional to a bandgap voltage (Vo) produced by the bandgap circuit (50) by an external control signal (Vcon) to produce the second resistance control signal (Vc). The first multiplier circuitry (43A, 46) includes a first resistor (43A) having a first terminal coupled to receive the reference voltage (Vref) and a second terminal coupled to a first input of a fourth operational amplifier (44) and a first terminal of a first FET resistor (46) having a source coupled to the reference voltage conductor (GND) and a gate coupled to an output (38) of the fourth operational amplifier (44). A second input of the fourth operational amplifier (44) is coupled to receive the bandgap voltage (Vo), the fourth operational amplifier (44) producing on its output (38) the voltage (38) proportional to the bandgap voltage (Vo). The second multiplier circuitry (43B,47) includes a second resistor (43B) having a first terminal coupled to receive the external control voltage (Vcon) and a second terminal (48) connected to a drain of a second FET resistor (47) having a source connected to the first reference voltage conductor (GND) and a gate connected to the output (30) of the fourth operational amplifier (44) to receive the voltage (38) proportional to the bandgap voltage (Vo) and produces the second control voltage (Vc) proportional to the external control voltage (Vcon) and the bandgap voltage whereby the second control voltage (Vc) compensates variation with respect to temperature that would otherwise be present in the gain A of the attenuator (20). In this embodiment, the attenuator has its gain A given by the expression $$A = \frac{m\left(e^{-\ln N\left(\frac{Vcon}{Vref}\right)}\right)}{2k}$$

where m, k and N are constants, Vcon is the external control voltage, and Vref is a constant reference voltage. In the described embodiments, a linearizing resistor (12) is coupled in parallel with the first variable resistor (13).

In one described embodiment, the attenuator has an output (66) coupled to an input of an amplifier (67) having an output (Vout). In another described embodiment, the attenuator is coupled between an output and an input of a differential amplifier (63).

In one embodiment, the invention provides a method for precision control of a variable resistor, including providing a first variable resistor (13) having a first terminal and a second terminal, and also having a resistance control terminal (16), a resistance between the first terminal and the second terminal being variable in response to a resistance control signal ($V_{ADJ}$) on the resistance control terminal. The method includes supplying a first current (I1) through a first conductor (14) to a first terminal of a reference resistor (11) having a second terminal connected to a reference voltage conductor (GND), supplying a second current (I2) through a second conductor (15) to the first terminal of the first variable resistor (13), and forcing a resistance of the first variable resistor (13) to be equal to a resistance of the first resistor (11) by sensing and amplifying a voltage difference between the first (14) and second (15) conductors to produce the first resistance control signal ($V_{ADJ}$) so as to minimize the voltage difference between the first (14) and second (15) conductors, to thereby cause the first variable resistor (13) to have the same precision as the reference resistor (11).

In one embodiment, the invention provides a circuit including a first variable resistor (13) having a first terminal and a second terminal, and also having a resistance control terminal (16), a resistance between the first terminal and the second terminal being variable in response to a resistance control signal ($V_{ADJ}$) on the resistance control terminal. The circuit means for supplying a first current (I1) through a first conductor (14) to a first terminal of a reference resistor (11) having a second terminal connected to a reference voltage conductor (GND), and also includes means for supplying a second current (I2) through a second conductor (15) to the first terminal of the first variable resistor (13), and means for forcing a resistance of the first variable resistor (13) to be equal to a resistance of the first resistor (11) by sensing and amplifying a voltage difference between the first (14) and second (15) conductors to produce the resistance control signal ($V_{ADJ}$) so as to minimize the voltage difference between the first (14) and second (15) conductors, to thereby cause the first variable resistor (13) to have the same precision as the reference resistor (11).

DETAILED DESCRIPTION OF THE PREFERRED EMBODIMENTS

The present invention provides a technique and architecture that provide a new way to create a very accurate voltage-controlled resistor which may be used to control, for example, the attenuation in dB of an attenuator or the gain in dB of a variable gain amplifier. Instead of the gain being created by a piece-wise approximation to an ideal gain curve as in the above described prior art, the gain curve in accordance with one embodiment of the present invention depends upon a mathematical formula that is almost independent of integrated circuit manufacturing process variations and temperature variations.

The structure and technique of the invention are based upon "slaving" a relatively inaccurate voltage controlled resistor to a precision reference resistor in order to cause the voltage controlled resistor to have the same precision as the reference resistor. In one embodiment of the invention, the voltage controlled resistor is implemented as a FET (field effect transistor) or a combination of FETs, and the slaving is accomplished in accordance with the well-known exponential relationship between the base-to-emitter voltage and the collector current of a bipolar transistor. In that embodiment, the invention provides circuitry that essentially eliminates the effect of the temperature sensitivity of the exponential characteristic of a bipolar transistor. The gain of an attenuator based on the voltage-controlled resistor circuitry of the present invention is nearly independent of integrated circuit manufacturing process parameter variations.

By way of definition, the term "FET resistor" as used herein is intended to encompass any field effect transistor device being used as a resistor.

Figure 1:
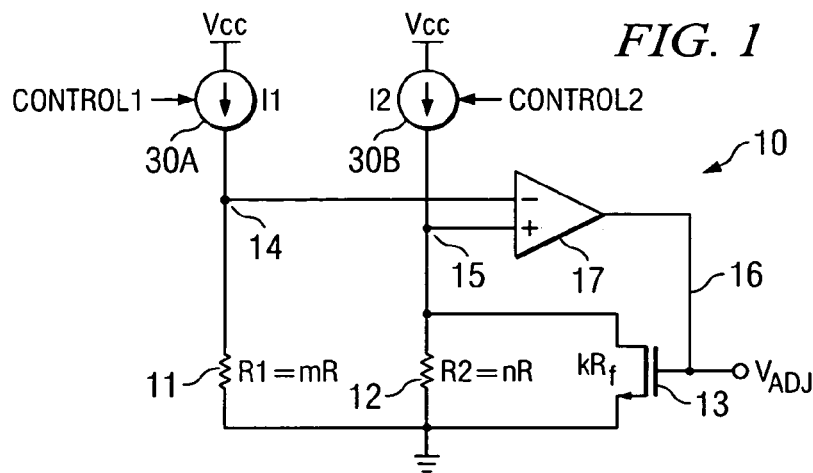
FIG. 1 is a diagram of a circuit that demonstrates how a voltage controlled FET resistor can be "slaved" to a high precision reference resistor so as to have the characteristics and precision thereof.

FIG. 1 shows a variable resistance controller circuit 10 that shows how a voltage-controlled FET resistor 13 having a resistance kRf can be "slaved" to a precision reference resistor 11 so as to have, in effect, the characteristics of the precision reference resistor 11. Referring to FIG. 1, a current source circuit 30A is connected between $V_{CC}$ and conductor 14 and provides its current $I_1$ through precision reference resistor 11. Similarly, a current source circuit 30B provides its current $I_2$ through conductor 15 to the parallel combination of resistor 12 and FET resistor 13. The lower terminals of resistors 11 and 12 are connected to ground. Current source circuit 30A can be controlled by an external signal CONTROL1, and current source circuit 30B can be controlled by an external signal CONTROL2, either of which can be a control current or a control voltage.

Figure 2:
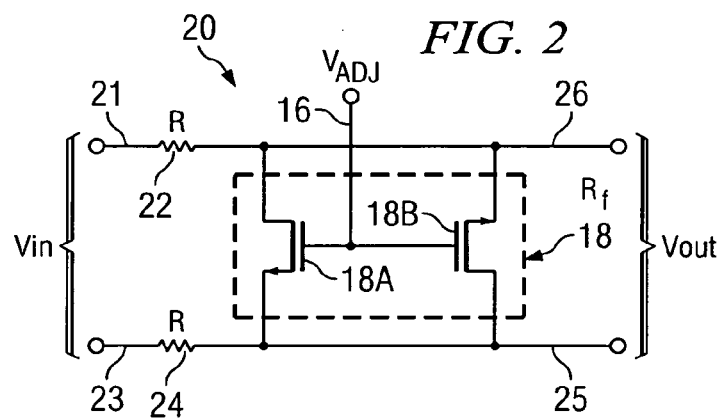
FIG. 2 is a schematic diagram of an attenuator based on a voltage-controlled variable FET resistor.
Figure 4:
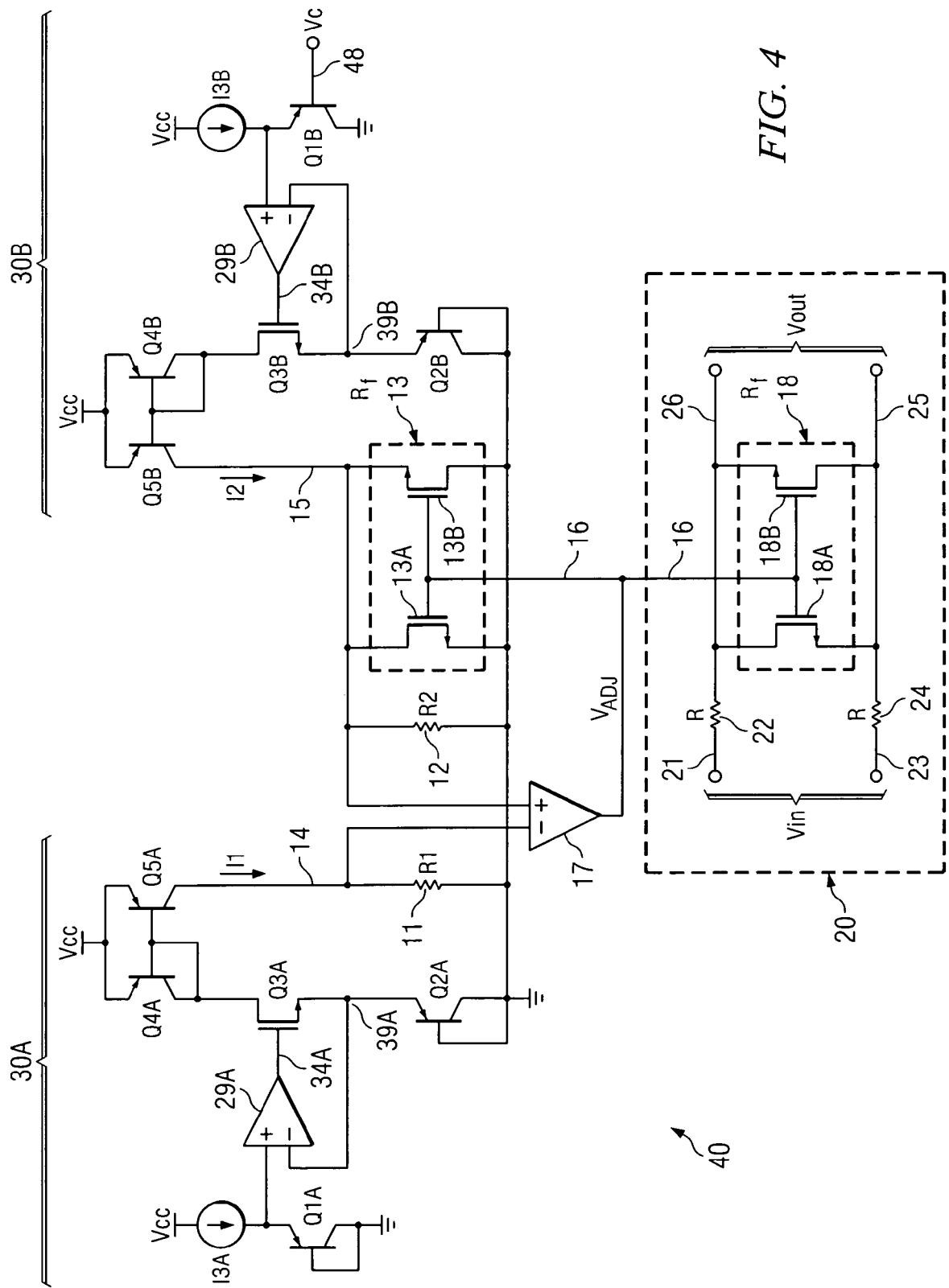
FIG. 4 is detailed schematic diagram of control circuitry coupled to an attenuator including a voltage-controlled FET resistor.

Reference resistor 11 has a resistance R1, which can be expressed as mR where m is a constant and R is the resistance of the input resistors 22 and 24 of attenuator 20 in FIG. 2. Resistor 12 has a resistance R2 which can be expressed as nR where n is a constant and R is the resistance of the input resistors 22 and 24 of attenuator 20 in FIG. 2. FET resistor 13 functions as a voltage controlled resistor having a nominal resistance that can be expressed as kRf where Rf is the nominal resistance of "composite" FET resistor 13 as shown in FIG. 4. The resistance Rf in FIG. 1 also can be the same as the nominal resistance of a composite FET resistor 18 shown in FIG. 2. Note that k is a constant of proportionality between the resistances of the FET resistors in FIG. 1 and FIG. 4, which are not of the same physical size. The constants m, n, and k allow semiconductor device scaling in order to achieve a more compact and/or more efficient design. The "nominal" resistance of Rf is its resistance under typical integrated circuit manufacturing process conditions.

The drain of N-channel field effect transistor 13, referred to hereinafter as "FET resistor" 13, is connected to conductor 15, and its source is connected to ground. Conductors 14 and 15 are connected to the (−) input and (+) input, respectively, of a high-gain operational amplifier 17. The output voltage $V_{ADJ}$ produced by operational amplifier 17 is connected by conductor 16 to the gate of FET resistor 13.

Operational amplifier 17 operates to force, i.e. cause or set, the voltages on conductors 14 and 15 to be equal by adjusting the resistance of FET resistor 13 until the equivalent parallel resistance of resistor 12 and FET resistor 13 is precisely equal to the resistance R1 of reference resistor 11. (More specifically, the resistance of FET resistor 13 is forced to be equal to the resistance mR of reference resistor 11 multiplied by the ratio of the control currents $I_1$ and $I_2$.) This causes the equivalent parallel resistance of resistor 12 and FET resistor 13 to have the same high precision as reference resistor 11. Thus, FET resistor 13, the resistance of which is not precise, is "slaved" by the operation of variable resistance controller circuit 10 so as to, in a sense, "borrow" the high precision of reference resistor $I_1$. The control currents $I_1$ and/or $I_2$ can be controlled so as to alter the value of $V_{ADJ}$.

The presence of resistor 12 connected in parallel with FET resistor 13, although theoretically optional, is important to obtaining good linearity of characteristic of $V_{ADJ}$ with respect to one or both of control currents $I_1$ or $I_2$. An ideal gain control characteristic is the ratio of two resistors. This attenuator, when its attenuation close to zero dB, does not exhibit this ideal characteristic. However, by distorting the control characteristic, it is possible to correct for the foregoing non-ideal characteristic. Examination of Equation 3 shows that it can be manipulated to accomplish a nearly ideal gain control characteristic.

Amplifier 17 goes into a balanced condition when the voltages on conductors 14 and 15 in FIG. 1 are equalized. It can be shown that this condition satisfies the relationship $$R_f = \frac{mnRI_1}{nkRI_2 - mkI_1},$$ Equation 1 where kRf is the resistance of FET resistor 13, mR is the resistance R1 of precision reference resistor, nR is the resistance of resistor R2 in FIG. 1 and also in subsequently described FIG. 4. R is the resistance of resistors 22 and 24 of attenuator 20 in FIG. 2, $I_1$ and $I_2$ are the control currents produced by current source circuits 30A and 30B in FIG. 1 in subsequently described FIG. 4, and k, m, and n are constants.

FIG. 2 is a schematic diagram of a voltage-controlled attenuator 20 based on voltage-controlled FET resistor 18. Attenuator 20 includes an input port including conductors 21 and 23, with an input resistor 22 of resistance R connected between input port conductor 21 and an output port conductor 22, with another input resistor 24 of resistance R coupled between input port conductor 23 and an output port conductor 25. A FET resistor 18 having a nominal resistance Rf includes two parallel-connected N-channel FET resistors 18A and 18B coupled between conductors 22 and 25, as shown. The gates of FET resistors 18A and 18B are connected to conductor 16, which receives the resistance adjustment control signal $V_{ADJ}$ produced on conductor 16 by operational amplifier 17 of FIG. 1.

The use of the two FET resistors 18A and 18B connected in parallel to form "composite" FET resistor 18 of nominal resistance Rf as shown in FIG. 2 has the effect of linearizing the operation of the resulting voltage-controlled FET resistor Rf. Computer simulations have demonstrated that an improvement in distortion performance is achieved by this parallel connection. Segmenting FET resistor 18 in FIG. 2 (and also FET resistor 13 in FIG. 4) into parallel identical field effect transistors can improve the linearity of their equivalent resistances, especially if the orientations of the alternate FET resistors are reversed. This is thought to occur because integrated circuit field effect transistors generally are not perfectly symmetrical, and therefore providing opposite orientations of parallel-connected FET resistors 18A and 18B in FIG. 2 has the effect of canceling the effects of their nonsymmetry. (The opposite orientations of alternate parallel-connected FET resistors 18A and 18B are illustrated by the asymmetrically located arrowheads on their respective source electrodes.)

The value of the attenuation A (i.e., the gain with a value less than 1) of attenuator 20 is given by $$A = \frac{R_f}{R_f + 2R},$$ Equation 2 where R is the value of series input resistors 22 and 24 of attenuator 20, and Vin and Vout are the input and output signals, respectively, of attenuator 20. Substituting Equation 1 into Equation 2 results in $$A = \frac{mn}{m(n-k) + \frac{25nkI_2}{I_1}}.$$ Equation 3

If n is set equal to k, then Equation 3 becomes $$A = \frac{m}{2kI_2/I_1}.$$ Equation 4

Examination of Equation 4 shows that if either of the control currents $I_1$ or $I_2$ is varied, then the attenuation A changes accordingly. Since either of control currents $I_1$ or $I_2$ can be controlled by a control voltage, the attenuation A can be proportional to either a control voltage or a control current.

A common requirement for attenuators is to have the attenuation, expressed in dB, controlled proportionally to a control current or a control voltage. In one embodiment of the present invention, this can be accomplished by using circuitry to generate the following relationships:

$$I_1 = I_0 e^{Vbe/Vt},\quad \text{Equation 5A}$$

$$I_2 = I_0 e^{(Vbe+Vc)/Vt},\quad \text{Equation 5B}$$

where $I_1$ is a bias current as shown in FIGS. 1 and 4 and 12 is a control current as also shown in FIGS. 1 and 4. $I_0$ is the saturation current of transistors Q2A and Q2B in subsequently described FIG. 4, Vbe is the base-to-emitter voltage of transistors Q2A and Q2B in FIG. 4, Vt is the thermal voltage of silicon, and Vc is the control voltage produced by the circuitry of FIGS. 5 and 6 and applied to conductor 48 in FIG. 4 to linearly control the value of attenuation (i.e., gain less than unity) A.

Equation 5A represents the well known relationship between the collector current and the base-to-emitter voltage of a bipolar transistor. The accuracy of this relationship is very predictable, and in accordance with one embodiment of the present invention the relationships of Equations 5A and 5B are utilized to generate the control currents $I_1$ and $I_2$ in FIGS. 1 and 4 so as to enable attenuator 20 to generate a very accurate approximation to a logarithmic gain characteristic over the range of the control voltage Vc.

Figure 3:
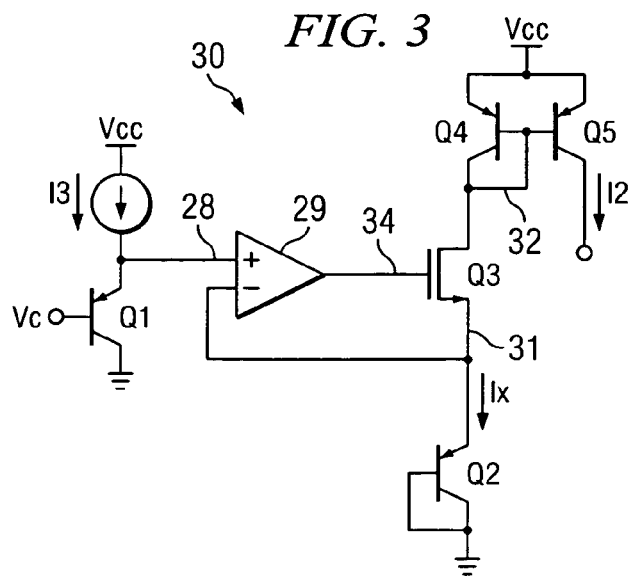
FIG. 3 is a schematic diagram of a circuit for creating an exponential signal to cause the attenuation, expressed in dB, of the attenuator in FIG. 2 to be proportional to a control signal.

FIG. 3 shows a circuit 30 that can be used to generate the relationships indicated by Equations 5A and 5B. In FIG. 3, a current source I3 is coupled between $V_{CC}$ and conductor 28 and supplies its current to the emitter of a PNP transistor Q1 having its collector connected to ground and its base coupled to the above mentioned control voltage Vc. Conductor 28 is connected to the (+) input of a high-gain operational amplifier 29, the output of which is connected by conductor 34 to the gate of a N-channel transistor Q3. The source of transistor Q3 is connected to the (−) input of operational amplifier 29 and to the emitter of diode-connected PNP transistor Q2, the collector and base of which are connected to ground. The drain of transistor Q3 is connected by conductor 32 to the collector and base of diode-connected PNP current mirror input transistor Q4 and to the base of PNP current mirror output transistor Q5. The emitters of transistors Q4 and Q5 are connected to $V_{CC}$. The collector of current mirror output transistor Q5 produces the control current $I_2$.

Control voltage Vc is applied to the base of transistor Q1 and the resulting voltage on conductor 28 is applied to the emitter of diode-connected transistor Q2 by the voltage follower operation of amplifier 29. The current $I_x$ in transistor Q2 is given by $$I_x = I_0 e^{(Vbe+Vc)/Vt}.\quad \text{Equation 5C}$$

$I_x$ flows through transistor Q3 and then, by the current mirror operation of transistors Q4 and Q5, emerges from the collector of transistor Q5 as control current $I_2$ from current mirror output transistor Q5, where $I_2$ is given by Equation 5B. If the control voltage term Vc in Equation 5C is set to zero, then the collector current of transistor Q5 in FIG. 3 is equal $I_1$ in Equation 5A.

The transfer characteristic of circuit 30 in FIG. 3 is generated so that the attenuation or gain of circuit 30, when expressed in dB, is precisely linear with respect to the control voltage Vc applied to the base of transistor Q1. If resistance control voltage Vc is linear, control circuit 30 produces $I_2$ as an exponential current in accordance with the well known relationship between the base-to-emitter voltage and the collector current of a bipolar transistor.

FIG. 4 shows a circuit 40 including a more complete diagram of the control circuitry together with attenuator 20. In FIG. 4, the current source circuitry 30A and the current source circuitry 30B both are in essence replicas of the circuit 30 shown in FIG. 3. The various components such as I3, Q1, 29, etc. of FIG. 3 correspond, respectively, to components I3A, Q1A, 29A, etc. in current source circuitry 30A of FIG. 4, and similarly correspond, respectively, to components I3B, Q1B, 29B, etc. in current source circuitry 30B of FIG. 4. However, the base of transistor Q1A of circuitry 30A is connected to ground, whereas in current source circuitry 30B the base of transistor Q1B is connected to the control voltage Vc.

Conductor 14 in FIG. 4 is connected to one terminal of resistor 11 of resistance R1. The other terminal of resistor R1 is connected to ground. Conductor 14 also is connected to the (−) input of high-gain operational amplifier 17. Conductor 15 of circuitry 30B is connected to the (+) input of operational amplifier 17 and to one terminal of resistor 12 of resistance R2. The other terminal of resistor R2 is connected to ground. Conductor 15 also is connected to the drains of two matching, parallel-connected FET resistors 13A and 13B, the sources of which are connected to ground. (Note that the sources and drains of a field effect transistor are interchangeable, depending only on their relative voltages.) The gates of transistors 13A and 13B are connected by conductor 16 to receive resistance adjustment voltage $V_{ADJ}$ from the output of operational amplifier 17.

Conductor 16 also is connected to the control input of attenuator 20. The voltage control terminal of attenuator 20 is connected to the gates of two parallel-connected N-channel FET resistors 18A and 18B coupled between attenuator output port conductors 22 and 25. The resistances of attenuator input resistors in FIG. 4 also can be equal to R as in FIG. 2 in order for Equations 6-13 to be correct.

Transistor Q1A in current source circuit 30A is biased by current source I3A, and voltage follower amplifier 29A accordingly applies the emitter voltage of transistor Q1A to the emitter of transistor Q2A. Transistors Q1A and Q2A are matched transistors, so the amount of current through transistor Q1A also flows through transistor Q2A. The same amount of current therefore flows through transistor Q3A and then through current mirror input transistor Q4A. If current mirror input and output transistors Q4A and Q5A are matched, then the same amount of current flows as current $I_1$ through resistor R1.

If Vc is equal to zero, then current source circuit 30B in FIG. 4 operates essentially the same as current source circuit 30A, and causes control current $I_1$ to be equal to control current $I_2$. However, if Vc is different than zero, then control current $I_2$ flowing through the equivalent resistance of resistor R2 in parallel with FET resistor Rf is different than control current I1, and operational amplifier 17 senses the difference between the resulting voltages on conductors 14 and 15 and modifies $V_{ADJ}$ to adjust the resistance of composite FET resistor 13 so as to equalize the voltages on conductors 14 and 15. This also correspondingly adjusts the resistance of composite FET resistor 18 of attenuator 20. The relationship between the bias current I1 that flows through resistor R1 and the control current I2 that flows through the parallel combination of resistor R2 and the composite FET resistor 18B is defined by above-mentioned Equation 1.

The voltage $V_{ADJ}$ on conductor 16 applied to the gates of composite FET resistor 13 is also applied to the gates of composite FET resistor 18, and adjusts the voltage-controlled attenuation A of attenuator 20, which is included in the circuitry of FIG. 4.

One reason for utilizing the two similar current source circuits 30A and 30B is that Equations 5A and 5B for $I_1$ and $I_2$, respectively, in FIG. 4 and the equations subsequently derived from them include process-dependent terms and temperature-dependent terms that need to be eliminated in order to achieve the desired high precision of the "linear in dB" transfer characteristic of circuit 40 in FIG. 4. The term $I_0$ is a function of the integrated circuit process parameters, and the thermal voltage Vt also is a function of both temperature and processing parameters. The term Vbe also is process-dependent and temperature-dependent. The subsequently described derivation of Equation 13 shows how the process-dependent terms and temperature-dependent terms appearing in the earlier equations in the derivation of Equations 13 are eliminated.

Substituting Equations 5A and 5B into Equation 4 yields $$A = \frac{me^{-Vc/Vt}}{2k}.$$

Equation 6

Inspection of Equation 6 shows that the process-dependent terms $I_0$ and Vbe have been eliminated from the attenuation A of attenuator 20. However, the thermal voltage term Vt, which is proportional to temperature, is still present in Equation 6. Second order effects cause the attenuation relationship shown in Equation 6 to be somewhat sensitive to integrated circuit process variation, but simulations have shown that the remaining effect of integrated circuit process parameter variation on the attenuation A is only approximately ±0.2 dB. This compares very favorably to the ±1 dB variation of attenuation A for state-of-the-art integrated circuit process parameter variation.

Taking the logarithm of both sides of Equation 6 results in $$\log A = \log\frac{me^{-Vc/Vt}}{2k}.$$

Equation 7

Multiplying both sides of Equation 7 by 20 results in $$20\log A = 20\log\frac{me^{-Vc/Vt}}{2k}$$
$$= 20\log\frac{m}{2k} + 20\log e^{-Vc/Vt}$$
$$= 20\left(\log\frac{m}{2k} - \frac{Vc}{Vt}\log e\right).$$

Equation 8

Figure 5:
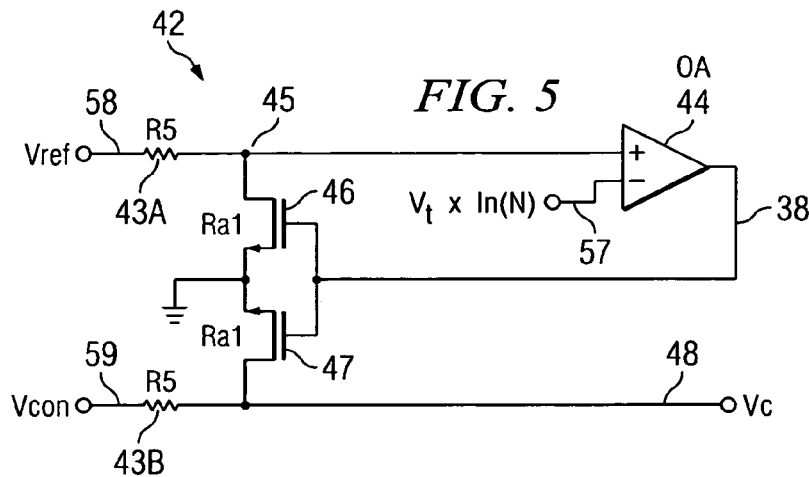
FIG. 5 is a schematic diagram of a circuit for connection to the circuit of FIG. 4 to eliminate its temperature sensitivity.

The term 20 log A on the left side of Equation 8 is the attenuator gain expressed in dB. Equation 8 therefore shows that the gain in dB is a linear function of the control voltage Vc FIG. 5 shows a diagram of a circuit that is used to eliminate the temperature sensitivity of the attenuator gain A resulting from the presence of the thermal voltage Vt in Equation 8. In FIG. 5, temperature compensation circuit 42 includes a pair of input resistors 43A and 43B each having a resistance R5. Resistor 43A is coupled between a reference voltage Vref and conductor 45, and resistor 43B is coupled between an external control voltage Vcon and conductor 48 on which a temperature-compensated version of resistance control voltage Vc is produced. Conductor 45 is connected to the (+) input of an operational amplifier 44 and to the drain of a N-channel FET resistor 46 having a nominal resistance of Ra1. The (−) input of operational amplifier 44 is connected by conductor 57 to receive a bandgap signal Vt×ln(N) from the bandgap reference voltage circuit 50 shown in FIG. 6. The source of FET resistor 46 is connected to ground. The output of operational amplifier 44 is connected by conductor 38 to the gate of FET resistor 46 and also to the gate of an N-channel FET resistor 47, which also has a nominal resistance of Ra1. The source of transistor 47 is connected to ground, and its drain is connected to conductor 48, on which the internal control voltage Vc is produced.

Vt is the well known thermal voltage of silicon and is given by $$Vt = kT/q,$$

Equation 9 where k is Boltzmans constant, T is the absolute temperature, and q is the electronic charge.

Resistor 43A of resistance R5 and variable-resistance FET resistor 46 of resistance Ra1 form a voltage controlled attenuator such that the voltage at the common node 45 of resistor 43A and FET resistor 46 is caused to be equal to the silicon thermal voltage Vt by the feedback operation of operational amplifier 44. This relationship is given by $$Vt \times \ln N = \left(\frac{Ra1}{Ra1 + R5}\right) Vref,$$

Equation 10 where R5 is a fixed input resistor, Ra1 is a voltage variable FET resistor, Vref is a reference voltage, and N is a constant equal to the ratio of the emitter area of transistor Q10 to that of transistor Q11.

Figure 6:
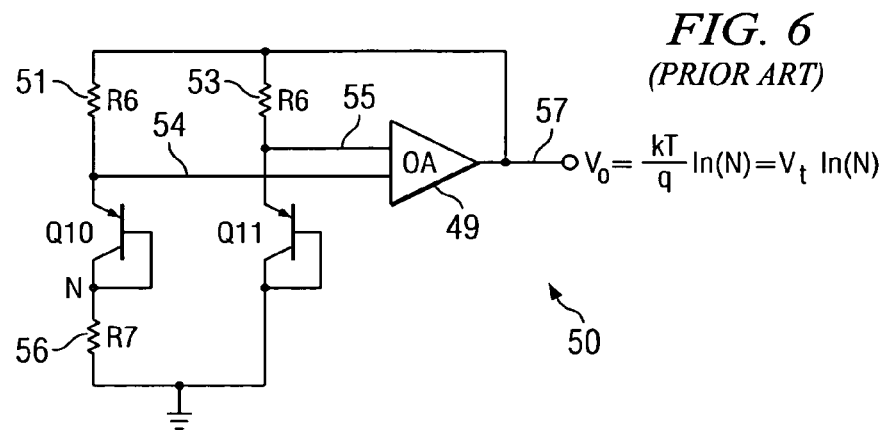
FIG. 6 is a schematic diagram of a prior art bandgap circuit for generating a voltage which is applied to an input of the circuit in FIG. 5.

Vt can be generated in many ways, one of which is shown in FIG. 6. In FIG. 6, conventional bandgap circuit 50 includes PNP transistor Q11 and PNP transistor Q10, the emitter area of which is N times that of transistor Q11. Equal currents through resistors 51 and 53, each of resistance R6, flow through transistors Q10 and Q11 when the inputs of operational amplifier 49 are balanced. This occurs when the output of operational amplifier 49 on conductor 57 has the value Vt×ln(N), which is the bandgap voltage developed across resistor 56.

The circuit 42 shown in FIG. 5 in essence is a multiplier circuit. Resistor R5 and FET resistor Ra1 associated with conductor 45 function as an attenuator (i.e., as a multiplier having a gain less than 1) in a control loop the output of which is the voltage Vt×ln(N), which is proportional to absolute temperature. The voltage Vt×ln(N) is applied to the (−) input of operational amplifier 44. A precision reference voltage Vref is referenced to the voltage Vt×ln(N) through an attenuator including resistor 43A and FET resistor 46. Circuit 42 of FIG. 5 also multiplies (attenuates) the external control voltage Vcon by means of an attenuator resistance including resistor 43B and FET resistor 47 so as to create the control voltage Vc on conductor 48 as a product of external control signal Vcon and Vt×ln(N). That is, the value of Vc is the value of the attenuation of resistor 43B and FET resistor 47 times Vcon, wherein the value of that attenuation is proportional to Vt. This has the effect of canceling the influence of Vt, i.e., the temperature dependence, attenuator gain A of circuit 40 in FIG. 4.

By way of definition, the term "multiplier" or "multiplier circuit" as used herein is intended to encompass any gain circuit irrespective of whether it has a gain less than 1, as in the case of an attenuator, or greater than or equal to 1, as in the case of an amplifier.

The voltage Vc on conductor 48 in FIG. 5, and hence also in FIG. 4, is given by the formula $$Vc = \left(\frac{Ra1}{Ra1 + R5}\right)Vcon,\qquad\text{Equation 11}$$

where Vcon is the external control voltage. Substituting Equation 10 into Equation 11 yields $$Vc = \frac{Vt \times \ln N}{Vref}Vcon.\qquad\text{Equation 12}$$

Substituting Equation 12 into Equation 6 causes cancellation of the term Vt, and yields $$A = \frac{m\left(e^{-\ln N\left(\frac{Vcon}{Vref}\right)}\right)}{2k}.\qquad\text{Equation 13}$$

Figure 7:
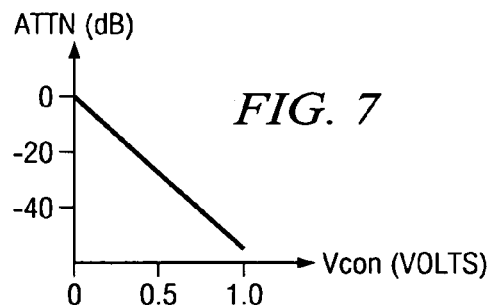
FIG. 7 is a graph illustrating the temperature-independent, process-independent attenuation function of an attenuator circuit based on a voltage-controlled FET resistor.

Examination of Equation 13 reveals that the attenuation A is no longer a function of temperature and is only a function of the control voltage Vcon, reference voltage Vref, and a constant m. FIG. 7 shows a plot of the linear attenuation function A as a function of the control voltage Vcon.

Although the above described embodiment shows an exponential characteristic, it could be any characteristic. For example, the control current I2 could be generated to have any desired characteristics for use in the circuitry of FIG. 1 without using the exponential circuit of FIG. 3, for example by using a computer in conjunction with a digital to analog converter, and the resulting resistance of FET resistor 13 and FET resistor 18 in FIG. 2 would be precisely "slaved" to reference resistor R2. Precision arbitrary control characteristics could be created conveniently with this precision, process-independent, temperature-independent variable resistor circuit, e.g., without using the exponential circuit of FIG. 3.

Computer simulations show that a variation in the attenuation (gain) A of less than ±0.2 dB can be achieved with respect to changes in wafer processing and/or in temperature, which is approximately a 5-fold improvement over the prior art. An additional benefit of the architecture and method of the invention is that the gain transfer characteristic is very smooth compared to that of other commonly used techniques which use a piece-wise approximation to a smooth transfer characteristic curve. The computer simulations indicate that the architecture and technique of the present invention create a gain curve in which the gain expressed in dB departs from an ideal straight line by as little as about 0.1 dB. (Note that foregoing 0.1 dB quantity is related to how closely the control characteristic approximates a straight line, whereas the 0.2 DB quantity is related to how closely the same control characteristic of the circuits on two different integrated circuit chips match each other.)

In a general sense, the invention provides a variable resistor having an exponential relationship that can be represented without the need to use a piecewise-linear approximation.

Figure 8:
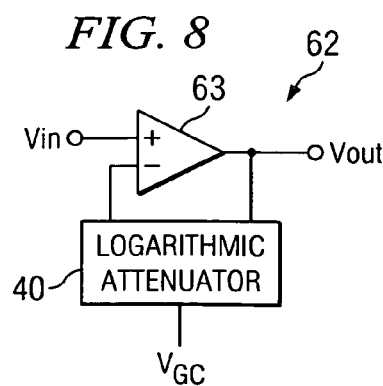
FIGS. 8 and 9 are diagrams of voltage-controlled variable gain amplifier configurations including a temperature-independent, process-independent voltage-controlled attenuator.
Figure 9:
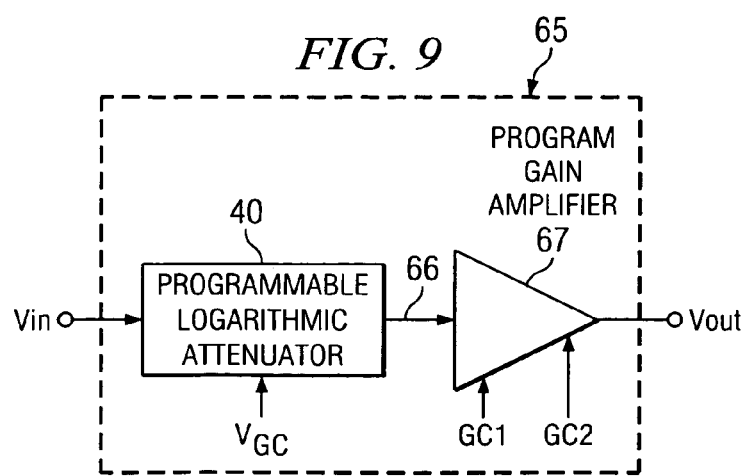

In one embodiment of the invention, the basic described technique is used to provide linear control of the resistance of FET resistor 13 while causing its characteristics, including its precision, to be "slaved to" and equal to the characteristics and precision of a precision resistor. This capability makes it more feasible to provide precise, non-piecewise-linear, remote control of various characteristics of various electronic devices.

l FIGS. 8 and 9 show two voltage controlled variable gain amplifier configurations that utilize the continuously adjustable attenuator of the present invention. FIG. 8 shows a logarithmic amplifier 62 which is an important practical application of the continuously adjustable logarithmic attenuator circuit 40 as shown in FIG. 4 (or more basic continuously adjustable logarithmic attenuator 20 as shown in FIG. 2), connected as a feedback element between the output and the inverting input of an operational amplifier 63, where the gain control $V_{GC}$ is the control voltage $V_C$ applied to conductor 48.

FIG. 9 shows a logarithmic amplifier 65 which includes continuously programmable, i.e., continuously adjustable, logarithmic attenuator 40 of FIG. 4 coupled between Vin and the input 66 of a conventional programmable gain amplifier which produces the voltage Vout, where $V_{GC}$ is the control voltage of continuously adjustable logarithmic attenuator 40 and GC1 and GC2 are gain control inputs of programmable gain amplifier 67.

In an operational amplifier, the gain is proportional to the feedback. Mechanical devices for adjusting the amount of feedback are commonly used in instrumentation applications to control a setting of an associated instrument. Tuning mechanisms are typically mechanical. The present invention can be easily adapted to computer-controlled, wireless remote control adjustment techniques and also to provide the high level of precision that is ordinarily associated with mechanical adjustment mechanisms.

While the invention has been described with reference to several particular embodiments thereof, those skilled in the art will be able to make various modifications to the described embodiments of the invention without departing from its true spirit and scope. It is intended that all elements or steps which are insubstantially different from those recited in the claims but perform substantially the same functions, respectively, in substantially the same way to achieve the same result as what is claimed are within the scope of the invention.

What is claimed is:

1. A circuit comprising:
   (a) a first variable resistor having a first terminal and a second terminal, and also having a resistance control terminal, a resistance of the first variable resistor between the first terminal and the second terminal being variable in response to a first resistance control signal on the resistance control terminal; and
   (b) a resistance control circuit including
      i. a first current source circuit for supplying a first current through a first conductor to a first terminal of a reference resistor having a second terminal connected to a reference voltage conductor,
      ii. a second current source circuit for supplying a second current through a second conductor to the first terminal of the first variable resistor,
      iii. a first operational amplifier having a first input coupled to the first conductor, a second input coupled to the second conductor, and an output conducting the first resistance control signal and coupled by a third conductor to the resistance control terminal of the first variable resistor, wherein the first operational amplifier acts to set the resistance of the first variable resistor to be equal to a resistance of the reference resistor; and
   wherein the first current source circuit includes a first exponential current circuit which produces the first current as a bias current proportional to a collector current of a first bipolar transistor, and wherein the second current source circuit includes a second exponential current circuit which produces the second current as a control current proportional to a collector current of a second bipolar transistor in response to a second resistance control signal.

2. The circuit of claim 1 wherein the first bipolar transistor is a diode-connected transistor, wherein the first current source circuit includes a first current source supplying its current to a first electrode of a third bipolar transistor that is diode-connected and referenced to the reference voltage conductor, a second operational amplifier having a first input coupled to the first electrode of the third bipolar transistor, an output coupled to a gate of a first field effect transistor having a source coupled to a second input of the second operational amplifier and a first electrode of the first bipolar transistor, and a drain coupled to an input of a first current mirror, the first current mirror having an output supplying the first current, and
wherein the second current source circuit includes a second current source supplying its current to a first electrode of a fourth bipolar transistor that is diode-connected and referenced to the reference voltage conductor, a third operational amplifier having a first input coupled to the first electrode of a fourth bipolar transistor, an output coupled to a gate of a second field effect transistor having a source coupled to a second input of the third operational amplifier and a first electrode of the second bipolar transistor, and a drain coupled to an input of a second current mirror, the second current mirror having an output supplying the second current.

3. The circuit of claim 2 including temperature compensation circuitry coupled to a base of the fourth bipolar transistor for compensating a temperature dependency in a gain of the attenuator.

4. The circuit of claim 3 wherein the temperature compensation circuitry includes a multiplier circuit coupled to receive an external control signal and a voltage proportional to a bandgap voltage for multiplying the voltage proportional to the bandgap voltage by the external control signal to produce the second resistance control signal.

5. The circuit of claim 4 wherein the multiplier circuit includes first multiplier circuitry receiving a reference voltage and the bandgap voltage for producing the voltage proportional to the bandgap voltage, and also includes second multiplier circuitry for producing the second resistance control signal proportionally to the external control voltage and the voltage proportional to the bandgap voltage.

6. The circuit of claim 5 wherein the first multiplier circuitry includes a first resistor having a first terminal coupled to receive the reference voltage and a second terminal coupled to a first input of a fourth operational amplifier and a first terminal of a first FET resistor having a source coupled to the reference voltage conductor and a gate coupled to an output of the fourth operational amplifier, a second input of the fourth operational amplifier being coupled to receive the bandgap voltage, the fourth operational amplifier producing on its output the voltage proportional to the bandgap voltage, and
wherein the second multiplier circuitry includes a second resistor having a first terminal coupled to receive the external control voltage and a second terminal connected to a drain of a second FET resistor having a source connected to the first reference voltage conductor and a gate connected to the output of the fourth operational amplifier to receive the voltage proportional to the bandgap voltage and producing the second control voltage proportional to the external control voltage and the bandgap voltage whereby the second control voltage compensates variation with respect to temperature that would otherwise be present in the gain of the attenuator.

7. The circuit of claim 4, wherein the attenuator has a gain A given by the expression $$A = \frac{m\left(e^{-\ln N\left(\frac{Vcon}{Vref}\right)}\right)}{2k}$$

where m, k and N are constants, Vcon is the external control voltage, and Vref is a constant reference voltage.

8. The circuit of claim 2, wherein the first, second, third, and fourth bipolar transistors are PNP transistors having their collectors coupled to the reference voltage conductor and wherein the first and second field effect transistors are N-channel transistors.

9. The circuit of claim 1 including a second variable resistor having a variable resistance between first and second terminals thereof, the second variable resistor having a resistance control terminal coupled to receive the first resistance control signal from the third conductor.

10. The circuit of claim 9, including an attenuator including a first input resistor coupled between a first input terminal and a first output terminal of the attenuator and a second input resistor coupled between a second input terminal and a second output terminal of the attenuator, the second variable resistor being coupled between the first and second output terminals of the attenuator.

11. The circuit of claim 9 including an attenuator including a first input resistor coupled between a first input terminal and a first output terminal of the attenuator and a second input resistor coupled between a second input terminal and a second output terminal of the attenuator, the second variable resistor being coupled between the first and second output terminals of the attenuator.

12. The circuit of claim 9 wherein the first variable resistor includes a first FET resistor and the second variable resistor includes a first FET resistor, wherein a gate, drain, and source of the first FET resistor of the first variable resistor are the resistance control terminal, first terminal, and second terminal, respectively, of the first variable resistor, and wherein a gate, drain, and source of the first FET resistor of the second variable resistor are the resistance control terminal, first terminal, and second terminal, respectively, of the second variable resistor.

13. The circuit of claim 11 including the attenuator having an output coupled to an input of an amplifier.

14. The circuit of claim 11 including an operational amplifier having an output and a feedback circuit coupled between the output and an input of the operational amplifier, the feedback circuit including the attenuator.

15. The circuit of claim 1 wherein the first variable resistor includes a first FET resistor, wherein a gate of the first FET resistor is the resistance control terminal of the first variable resistor, a drain of the first FET resistor is the first terminal of the first variable resistor, and a source of the first FET resistor is the second terminal of the first variable resistor.

16. The circuit of claim 1 including a linearizing resistor coupled in parallel with the first variable resistor.

17. A method for precision control of a variable resistor, comprising:
(a) providing a first variable resistor having a first terminal and a second terminal, and also having a resistance control terminal, a resistance between the first terminal and the second terminal being variable in response to a first resistance control signal on the resistance control terminal;

(b) supplying a first current through a first conductor to a first terminal of a reference resistor having a second terminal connected to a reference voltage conductor by means of a first exponential current circuit which produces the first current as a bias current proportional to a collector current of a first bipolar transistor in response to a fixed reference voltage on the reference voltage conductor, and supplying a second current through a second conductor to the first terminal of the first variable resistor by means of a second exponential current circuit which produces the second current has a control current proportional to a collector current of a second bipolar transistor in response to a second resistance control signal; and (c) adjusting a resistance of the first variable resistor to be equal to a resistance of the first resistor by sensing and amplifying a voltage difference between the first and second conductors to produce the first resistance control signal so as to minimize the voltage difference between the first and second conductors, to thereby cause the first variable resistor to have the same precision as the reference resistor.

18. The method of claim 17 including providing a second variable resistor, the second variable resistor having a resistance control terminal coupled to receive the first resistance control signal.

19. A circuit comprising:

(a) a variable resistor having a first terminal and a second terminal, and also having a resistance control terminal, a resistance of the variable resistor between the first terminal and the second terminal being variable in response to a first resistance control signal on the resistance control terminal;

(b) first exponential current circuit means for supplying a first current through a first conductor to a first terminal of a reference resistor having a second terminal connected to a reference voltage conductor and second exponential current circuit means for supplying a second current through a second conductor to the first terminal of the variable resistor; and (c) means for adjusting a resistance of the variable resistor to be equal to a resistance of the first resistor by sensing and amplifying a voltage difference between the first and second conductors to produce the resistance control signal so as to minimize the voltage difference between the first and second conductors, to thereby cause the variable resistor to have the same precision as the reference resistor.

\* \* \* \* \*